United States Patent
Kasten

(10) Patent No.: US 7,982,566 B2
(45) Date of Patent: Jul. 19, 2011

(54) CRYOSTAT HAVING A MAGNET COIL SYSTEM, WHICH COMPRISES AN LTS SECTION AND AN HTS SECTION, WHICH IS ARRANGED IN THE VACUUM PART

(75) Inventor: Arne Kasten, Karlsruhe (DE)

(73) Assignee: Bruker BioSpin GmbH, Rheinstetten (DE)

( * ) Notice: Subject to any disclaimer, the term of this patent is extended or adjusted under 35 U.S.C. 154(b) by 514 days.

(21) Appl. No.: 12/225,189

(22) PCT Filed: Mar. 7, 2007

(86) PCT No.: PCT/EP2007/001924
§ 371 (c)(1),
(2), (4) Date: Sep. 16, 2008

(87) PCT Pub. No.: WO2007/107238
PCT Pub. Date: Sep. 27, 2007

(65) Prior Publication Data
US 2009/0045895 A1    Feb. 19, 2009

(30) Foreign Application Priority Data
Mar. 18, 2006 (DE) .......................... 10 2006 012 509

(51) Int. Cl.
*H01F 7/00* (2006.01)
*H01F 1/00* (2006.01)
*H01F 6/00* (2006.01)
*H01F 41/00* (2006.01)
*G01V 3/00* (2006.01)

(52) U.S. Cl. ........ 335/216; 335/217; 335/296; 335/299; 335/301; 324/318; 324/319; 324/320; 505/150

(58) Field of Classification Search .......... 335/216–217, 335/296–301; 324/318–320; 505/150, 951; 336/155
See application file for complete search history.

(56) References Cited

U.S. PATENT DOCUMENTS

| | | | | |
|---|---|---|---|---|
| 5,426,366 A | * | 6/1995 | Overweg et al. | 324/319 |
| 5,744,959 A | * | 4/1998 | Jeker et al. | 324/319 |
| 6,192,690 B1 | * | 2/2001 | Stautner | 62/6 |

(Continued)

FOREIGN PATENT DOCUMENTS

DE     201 13 547     3/2002

(Continued)

*Primary Examiner* — Anh T Mai
*Assistant Examiner* — Mohamad A Musleh
(74) *Attorney, Agent, or Firm* — Paul Vincent

(57) ABSTRACT

A cryostat (1) with a magnet coil system including superconductors for the production of a magnet field $B_0$ in a measuring volume (3) within a room temperature bore (2) of the cryostat has a plurality of radially nested solenoid-shaped coil sections (4, 5, 6) which surround the room temperature bore and which are electrically connected in series, at least one of which being an LTS section (5, 6) with a conventional low temperature superconductor (LTS) and at least one of which being an HTS section (4) including a high temperature superconductor (HTS), wherein the LTS section (5, 6) is located in a helium tank (9) of the cryostat (1) along with liquid helium at a helium temperature $T_L$. The apparatus is characterized in that the HTS section (4) is disposed radially within the LTS section (5, 6) in a vacuum portion of the cryostat and is separated from the LTS section (5, 6) by the helium tank (9) wall (9a) facing the room temperature bore. The HTS coil section can be reliably used in the cryostat over a long period of time (FIG. 1*a*).

16 Claims, 4 Drawing Sheets

U.S. PATENT DOCUMENTS

| | | | |
|---|---|---|---|
| 2002/0101240 A1* | 8/2002 | Kasten | 324/318 |
| 2003/0094951 A1* | 5/2003 | Schlenga et al. | 324/322 |
| 2005/0174118 A1* | 8/2005 | Kasten et al. | 324/318 |
| 2006/0066429 A1* | 3/2006 | Kasten | 335/296 |

FOREIGN PATENT DOCUMENTS

| | | |
|---|---|---|
| DE | 10 2004 007340 | 9/2005 |
| EP | 0 780 698 | 6/1997 |
| EP | 0 905 436 | 3/1999 |

* cited by examiner

CRYOSTAT HAVING A MAGNET COIL SYSTEM, WHICH COMPRISES AN LTS SECTION AND AN HTS SECTION, WHICH IS ARRANGED IN THE VACUUM PART

This application is the national stage of PCT/EP2007/001924 filed on Mar. 7, 2007 and also claims Paris Convention priority to DE 10 2006 012 509.6 filed Mar. 18, 2006.

BACKGROUND OF THE INVENTION

The invention concerns a cryostat having a magnetic coil system including superconducting materials for generation of a magnetic field $B_0$ within a measurement volume, the magnet system having a plurality of radially nested solenoid-shaped coil sections connected in series at least one of which is an LTS section of a conventional low temperature superconductor (LTS) and with at least one HTS section of a high temperature superconductor (HTS), wherein the LTS portion is located in a helium tank of the cryostat having liquid helium at a helium temperature $T_L$.

Cryostats of this kind are e.g. disclosed in DE 10 2004 007 340 A1.

By way of example, nuclear magnetic resonance systems, in particular spectrometers, require very strong, homogenous and stable magnetic fields. The stronger the magnetic field, the better the signal to noise ratio as well as the spectral resolution of the NMR measurement.

Superconducting magnet coil systems are used to produce strong magnetic fields. Magnetic coil systems having solenoid-shaped coil sections are widely used which are nested within each other and operated in series. Superconductors can carry electrical current without losses. The superconducting condition is established below the material-dependent transition temperature. Conventional low temperature superconductors (LTS) are normally utilized for the superconducting material. These metallic alloys, such as NbTi and $Nb_3S$, are relatively easy to process and are reliable in application. An LTS coil-portion conductor usually comprises a normally conducting metallic matrix (copper) in which superconducting filaments are embedded and which, during normal operation, completely carry the current. In the case of NbTi, these are usually several tens or hundreds of filaments; in the case of $Nb_3Sn$, the filament number could be more than one hundred thousand. Although the internal construction of the conductor is actually somewhat more complex, this is irrelevant within the present context.

The coil sections are cooled with liquid helium within a cryostat in order to cool the superconducting portions below the transition temperature. The superconducting coil sections are thereby at least partially immersed in the liquid helium.

In order to further increase the magnetic field strength of the magnetic coil system it is desirable to also utilize a high temperature superconductor (HTS). For a given temperature, conductors, which include HTS, can carry much more current and thereby achieve higher magnetic field strengths than those with LTS. HTS materials are thereby appropriate for use in the inner most coil sections of a magnetic coil system.

HTS or ceramic superconductors are currently primarily made from bismuth conductors with HTS filaments within a silver matrix. The conductors are usually stripe or band-shaped.

Coil sections made from HTS have turned out to be unreliable and susceptible to short lifetimes, particularly in under-cooled helium. Investigation of defective HTS portions has shown that the HTS material is split open, thereby destroying the current carrying capability of the HTS conductor. This effect, which is also known in other context, is occasionally referred to as "ballooning".

It is accordingly the purpose of the present invention to present a cryostat in which HTS coil portions enjoy a long lifetime and can be utilized in a reliable manner, in particular, without ballooning.

SUMMARY OF THE INVENTION

This purpose is achieved by a cryostat of the above-mentioned kind in that the HTS section is disposed radially within the LTS section in a vacuum portion of the cryostat and is separated from the LTS section by means of a wall of the helium tank facing the room temperature bore.

In accordance with the present invention, it has been discovered that the ballooning is caused by helium, which expands or evaporates within the HTS material. As is well known, helium liquefies at a pressure of 1 bar below approximately 4.2 K. HTS material is ceramic and therefore has a certain porosity. Liquid helium can pass through the pores into the inner portions of the HTS material. In particular, in a superfluid state of helium, which obtains below the λ point temperature of approximately 2.2 K, helium can pass through the smallest of gaps. In the event that subsequently heats beyond the evaporation point, it then expands rapidly in volume during evaporation. If the warming occurs too rapidly, the evaporating helium cannot escape quickly enough from the porous material and a substantial amount of pressure is built up within the pores of the HTS. Since the HTS material is ceramic and relatively brittle, the HTS can be explode in consequence of this pressure.

All these effects can be prevented with the cryostat configuration in accordance with the invention. The HTS section or sections of the magnetic coil system and thereby all of the HTS material is disposed in a vacuum portion of the cryostat between the inner wall of the helium tank and the room temperature bore. Clearly, no liquid helium is present in that vacuum portion. Moreover, the vacuum portion of an NMR cryostat is usually one integral piece. For example, the HTS section has an outer circularly cylindrical periphery which seats on the likewise circularly cylindrical inner wall of the helium tank and is thereby positively connected to the radially inner LTS section, which, if appropriate, seats on this wall from the helium side by means of small spacers. Since the HTS materials of the HTS section are in vacuum and do not come in contact with liquid helium, evaporation of helium, which has seeped into the inner portions of the HTS material is thereby avoided. The ballooning effect of the HTS material is therefore prevented.

Cooling power for the HTS section can be transferred from the helium tank wall to the HTS section by means of thermal contacts, e.g. made from copper. Towards this end, the operating temperature of the HTS section can clearly be somewhat higher than that of the LTS section in the helium tank since, at a temperature of about or below 4 K, the critical current of the HTS conductor is only weakly dependent on temperature, in contrast to the situation for the LTS sections. This is particularly true when the helium in the tank is under-cooled to approximately 2 K.

In an advantageous embodiment of the cryostat in accordance with the invention, the temperature of the liquid helium $T_L < 4$ K, preferentially $< 2.5$ K, in particular $< 2.2$ K. At this low temperature, the danger of ballooning is particularly high without the measures in accordance with the invention so that the advantages of the invention are particularly great. Since the critical current density of the conductor of the LTS section increases with lower temperature, the lower temperatures enable higher magnetic field strengths $B_0$ and/or more compact LTS sections.

In a preferred embodiment of the cryostat in accordance with the invention, the superconducting leads to at least one HTS section also travel in the vacuum portion, at least to the extent that the leads contain HTS material. In this manner, all HTS materials, including the joints, are protected from liquid helium. Conductors generally made from a conventional superconducting material, e.g. a NbTi multi-filament wire, extend from these joints to a vacuum tight feed-through and into the helium tank, preferentially in a region of the helium tank which does not usually contain liquid helium or at least no superfluid helium. The superconductor is passed through this feed-through so that the complete magnetic current can flow to and from the HTS and LTS sections without loss. A superconducting switch for loss free persistent current mode operation is normally located in the helium tank: with vertically disposed magnet coils, above the LTS section. In the case of two coupled helium tanks with approximately 2 K (with the LTS section) and approximately 4 K, the feed-throughs are preferentially passed from the vacuum into the 4 K tank.

In a further preferred embodiment, the LTS section is mechanically rigidly connected to the HTS section, in particular by means of or via the wall of the helium tank. This leads to a particularly mechanically stable configuration for the magnetic coil system and thereby the magnetic field strength $B_0$.

In a further preferred embodiment, the HTS section is thermally coupled to the wall of the helium tank. In this manner, sufficient cooling of the HTS section is achieved in a straightforward manner.

In a further advantageous embodiment, at least one radiative shield is located between the HTS section and the room temperature bore which is preferentially coupled to the helium tank to thereby have a temperature of approximately 4.2 K. The radiation shield reduces the radiative heat input from the room temperature bore into the HTS section.

If required, it is also possible to take steps to thermally shield the leads which run in the vacuum portion to the HTS section in that they pass within the radiative shield or are cooled by heat conducting leads which run parallel thereto and which have good thermal conductivity. In this manner, a quenching of these leads, including possible joints, can be avoided.

In an advantageous embodiment, a sorption medium for helium is disposed in the vacuum portion, in particular activated charcoal. This obviates the need for long-term use of external or transport pumps.

In a particular preferred embodiment of the invention, the magnetic field produced by the magnet coil system in the measurement volume $B_0 > 20$ T, in particular $> 23$ T. These strong magnetic fields can easily be achieved with the HTS section and the cryostat in accordance with the invention. In contrast thereto, conventional magnet systems that only have LTS-based sections already reach the theoretical limit at these field strengths, having a critical current density which approaches 0.

In a further preferred embodiment, the coil sections of the magnetic coil system are superconducting short circuited (persistent current mode) during operation. This leads to a particularly stable time dependence of the magnetic field $B_0$.

In a further preferred embodiment, the magnetic coil system has a magnetic field $B_0$ homogeneity in the measurement volume and a time stability for the magnetic field $B_0$ that satisfy the requirements for high resolution NMR spectroscopy.

A further embodiment is preferred with which the cryostat has an additional helium tank with a temperature of helium held therein of approximately 4.2 K and which is connected to the (first) helium tank. The liquid helium in the (first) helium tank has a temperature of $T_L < 4$ K. The use of two helium tanks permits the LTS section to be operated at a lower temperature, which leads to higher current capability. Moreover, helium evaporates from the cryostat under normal pressure and therefore can also be refilled at normal pressures. This increases the efficiency of the cooling and the operational safety.

In a preferred improvement in this embodiment, the series connection between the LTS section in the helium tank and the HTS section in the vacuum portion extends through the additional helium tank. The feed through of the superconducting leads into the vacuum portion is therefore effected via the additional helium tank. This is preferably the case when the (first) helium tank contains superfluid helium, since this procedure simplifies reliable sealing of the current feed-through.

In a preferred improvement, the additional helium tank is disposed above the helium tank about a common vertical room temperature bore. In this configuration, both tanks can be separated by a vacuum barrier and coupled through a narrow e.g. gap-shaped connection. The upper tank can be located at normal pressure or slightly above so that, in total, the refilling of helium is easier and safer.

In a further improvement, the wall of the additional helium tank facing the room temperature bore is separated in a radial direction from the room temperature bore by a same amount as the wall of the helium tank facing the room temperature bore. This permits a particularly simple introduction of a horizontal feed-through into the additional helium tank at a height at which liquid helium in the additional tank is normally not located. This, in turn, simplifies sealing of the feed-through. It also leads to a topologically uniform inner bore to the extent to which that bore is bordered by the helium tank. This improves accessibility and use of the bore.

Alternative thereto, the side of the wall of the additional helium tank facing the room temperature bore can be radially closer to the room temperature bore than the wall of the helium facing the room temperature bore. This embodiment permits a straightforward introduction of the current leads into the flat floor plate of the additional (upper) helium tank. The volume of the additional helium tank can thereby be increased which leads to a longer holding time for the helium. It is additionally preferred when the wall of the additional helium tank facing the room temperature bore is aligned with the inner bore of the HTS section.

Further advantages of the invention can be derived from the description of the drawings. The above-mentioned features and those to be discussed below can be utilized in accordance with the invention individually or collectively in arbitrary combination. The embodiments shown and described are not to be considered exhaustive enumeration, rather have exemplary character only for illustrating the invention.

BRIEF DESCRIPTION OF THE DRAWING

The invention is represented in the drawing and is further explained with reference to embodiments.

FIG. 3 shows a schematic circuit diagram of the sections of FIG. 1a; and

DESCRIPTION OF THE PREFERRED EMBODIMENT

Figure 1A:
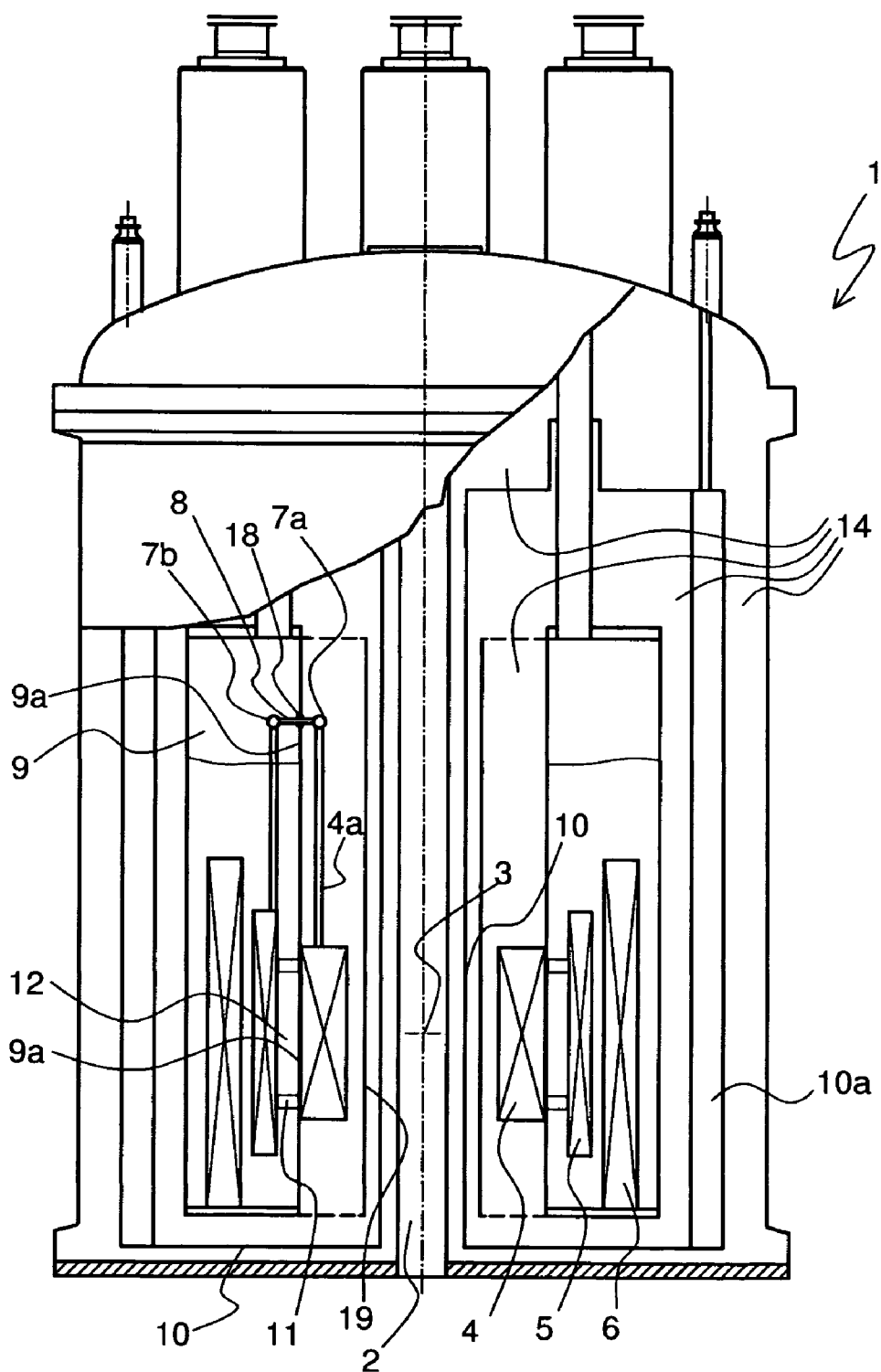
FIG. 1a shows a schematic representation of a first embodiment of a cryostat in accordance with the invention having an HTS section in vacuum and associated joints and feed throughs.

FIG. 1a shows a first embodiment of a cryostat 1 in accordance with the invention. The cryostat 1 has a room temperature bore 2 in which a measuring volume 3 for a sample is provided. The measuring volume 3 is located in the center of a magnetic coil system, which is formed by three solenoid-shaped coil section 4, 5, 6. The radially innermost coil section 4 has a wounding made from high temperature superconductor (HTS). The middle coil section 5 is wound with $Nb_3Sn$ wire and the outer most coil section 6 is wound with NbTi wire. The coil sections 5, 6 therefore represent low temperature superconductor (LTS) coil sections. The coil sections 4, 5, 6 are electrically connected to each other in series, as is shown in an exemplary fashion by means of superconducting joints 7a and 7b. At joint 7a, the high HTS material of a lead 4a is connected to a HTS coil section 4 by means of an adaptor section 8 made from NbTi. At joint 7b, the adaptor member 8 is connected to the $Nb_3Sn$ wire of the LTS section 5. The adaptor section 8 passes through a feed-through 18 in the wall 9a of a helium tank 9 in which mutually nested LTS sections 5 and 6 are located. The feed-through 18 is a conventional electrical low temperature vacuum feed-through having metallic tubes which are insulated which respect to each other and with respect to the wall of the tank to which the respective conductors of the adaptor piece 8 are soldered in a vacuum tight fashion. The wall 9a of the helium tank faces the room temperature bore 2.

The helium tank 9 is substantially filled with liquid helium. The helium tank 9 has a temperature $T_L$ of approximate 4 K. For insulation purposes, the helium tank 9 is completely surrounded by a radiation shield 10, in particular, in a radially outer direction. The radiation shield 10 also extends between the HTS section 4 and the room temperature bore 2. The radiation shield 10 is cooled with liquid nitrogen, which is filled into a container 10a. Additional radiation shields can also be provided for which are usually cooled by the evaporating helium gas. Alternatively or in addition thereto, the radiation shields can be cooled by refrigerators, wherein the nitrogen tank 10 can then be eliminated. The refrigerator can also re-cool the evaporated helium so that the refilling interval for liquid helium can be increased or such that the refilling of helium is only necessary following a break down.

The LTS coil sections 5, 6 are immersed in liquid helium. The HTS sections 4, including the leads 4a and the joints 7a, are disposed in vacuum between the helium tank 9 and the room temperature bore 2. In this manner, no liquid helium can flow into the HTS material of the HTS coil sections 4 or their leads 4a. In consequence thereof, one prevents liquid helium from evaporating within the HTS material, thereby leading to an increased volume within the HTS material and possible rupturing thereof.

The overall evacuated inner region of cryostat 1 constitutes the vacuum portion 14 of the cryostat and within this vacuum portion 14 is an HTS section 4 in accordance with the invention. A pressure of less than $10^{-5}$ mbar is present in vacuum portion 14.

The HTS coil section 4 is preferentially positively connected to the inner wall 9a of the helium tank 9 and is cooled by that tank wall 9a. Towards this end, a good conductor such as metallic copper can e.g. be utilized. The LTS section can be positively connected to the helium tank wall 9a, optionally by means of spacer pieces 11a. A small separation with respect to the tank wall 9a produces a gap 12 by means of which helium convection can be induced in a radial sense within the section 5. Alternatively, the section 5 is directly flush with the wall 9a. It is normally permissible for the HTS section 4 to be somewhat warmer than the LTS sections 5 and 6. An additional radiation shield 19 is disposed between the HTS section 4 and the room temperature bore 2 for thermal shielding of section 4. The radiation shield 19 is cooled via the liquid helium in the helium tank 9. Additional radiative shields can be utilized for shielding the HTS section 4.

Figure 1B:
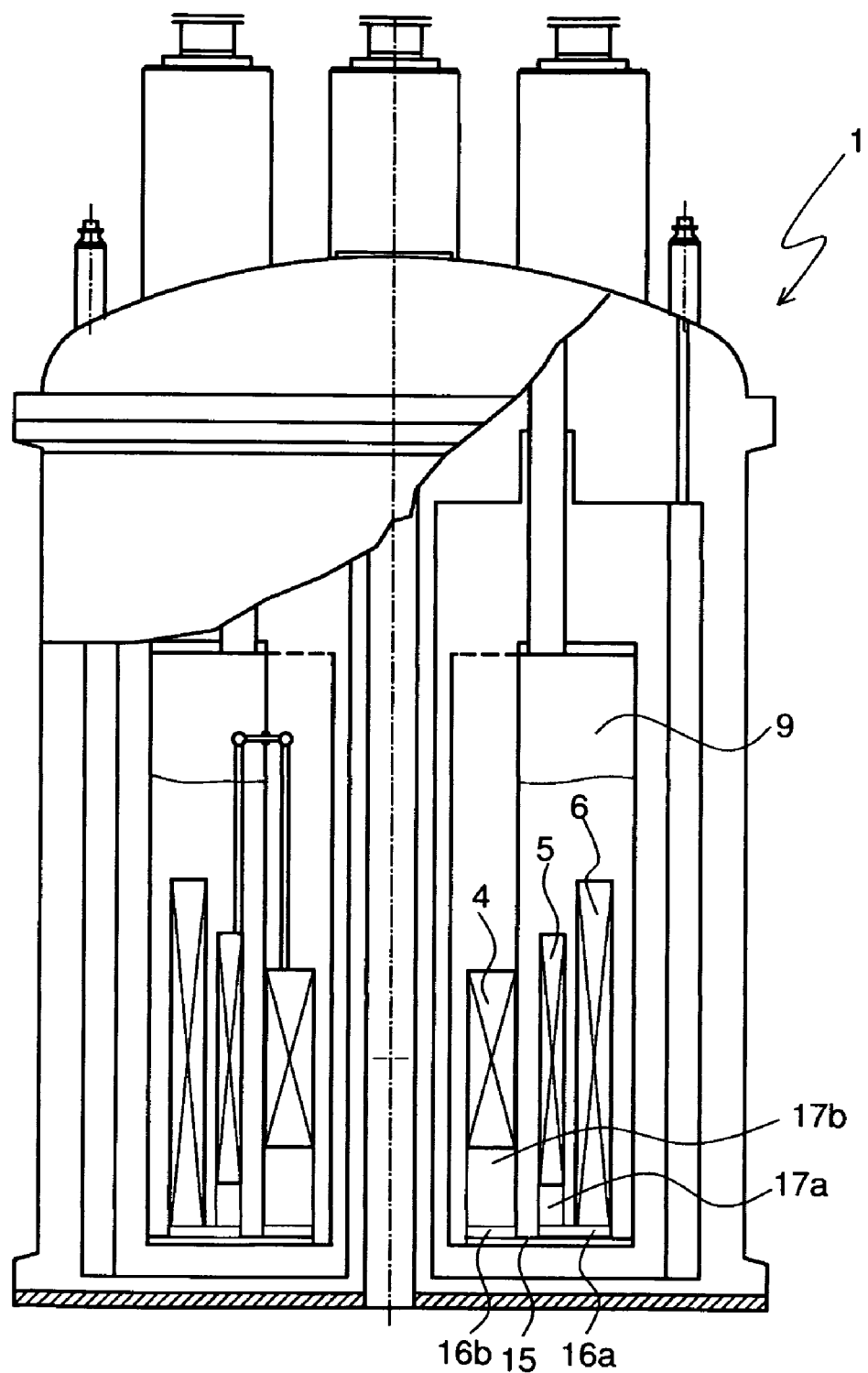
FIG. 1b shows a schematic representation of a second embodiment of a cryostat in accordance with the invention having an HTS section in vacuum with a common floor plate for the coil sections.

A second embodiment of the cryostat 1 in accordance with the invention is shown in FIG. 1b. This embodiment substantially corresponds to that of FIG. 1a, however, entails a particular anchoring of coil sections 4, 5, 6.

A radially outer portion of a floor plate 15 forms the lower wall of the helium tank 9. The floor plate 15 extends in a radially inward direction up to beneath the HTS section 4. Two ring flanges 16a, 16b are attached to the floor plate 15. The LTS section 6 is directly attached to the radially outer ring flange 16a and the LTS section 5 is indirectly attached thereto by means of a coil support 17a. The HTS section is attached to the radially inner ring flange 16b by means of a coil support 17b. The floor plate 15 is preferentially formed from a single piece. This configuration permits simultaneous handling of all coil sections 4, 5 and 6 during assembly of the cryostat 1 by means of the common floor plate 15.

Figure 2:
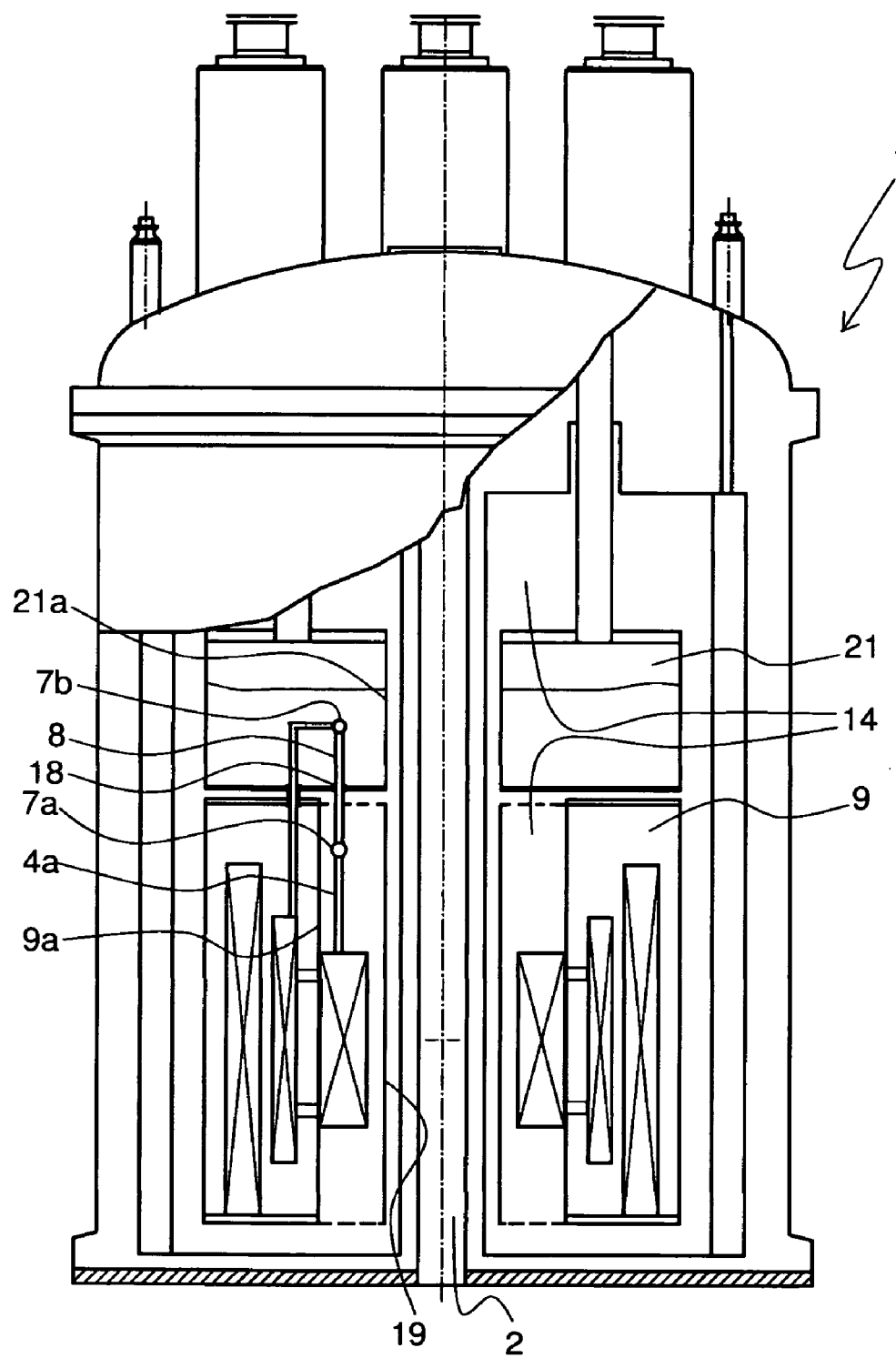
FIG. 2 shows a schematic representation a third embodiment of a cryostat in accordance with the invention having an HTS section vacuum and with two helium tanks.

The third embodiment of cryostat 1 in accordance with the invention shown in FIG. 2 corresponds substantially to the cryostat of FIG. 1. However, cryostat 1 of FIG. 2 has helium tank 9 as well as an additional, upwardly disposed helium tank 21. Both helium tanks 9, 21 contain helium at different temperatures. The lower helium tank 9 is at approximately 2 K and the upper additional tank 21 at approximately 4 K. Cryostats 1 of this type are preferentially utilized to produce very high magnetic fields, in particular in high field NMR systems.

In the embodiment shown in FIG. 2, the additional helium tank 21 extends further in the inward direction (towards the room temperature bore 2) than does the lower helium tank 9, wherein a feed through 18 for the adaptor piece 8 is disposed on the floor of the additional helium tank 21. The inner wall 21a of the additional helium tank 21 which faces the room temperature bore 22 is located at an equal radial separation from the room temperature inner bore 2 as the radiation shield 19. The inner wall 9a of the helium tank 9 is set back with respect thereto. This configuration permits efficient use of the region within the cryostat 1.

In an alternative embodiment (not shown) the inner wall of the additional helium tank can also have the same radial separation from the room temperature bore 2 as the inner wall 9a of the helium tank 9 in FIG. 1b. This provides space for feeding through the superconducting adaptor pieces from the vacuum portion into the upper additional helium tank in a horizontal direction through the inner wall of the additional helium tank. The feed-through is thereby preferentially located above the surface of the liquid helium in the additional helium tank. This facilitates secure sealing of the feed-through.

Figure 3:
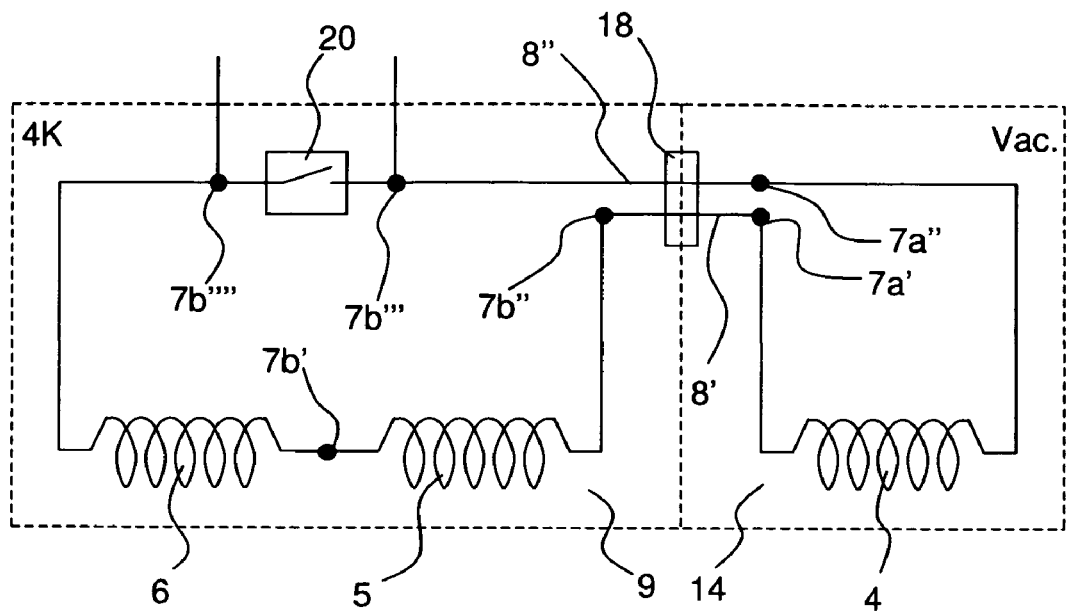

FIG. 3 schematically shows the electrical connection of the coil sections 4, 5, 6 of FIG. 1a. The inner region of the helium tank 9 (helium region) is shown as a block of dotted lines as is the region of the vacuum portion 14 of the cryostat (vacuum region).

The LTS section 6 (NbTi) and 5 ($Nb_3Sn$) are disposed within the helium region 9 in liquid helium at approximately 4 K. The LTS sections 5, 6 are connected in series by means of a superconducting connector 7b' (joint). The LTS section 5 is connected, via an additional superconducting connection 7b'', with an adaptor piece 8' which is fed through the vacuum feed-through 18 out of the helium region 9 into the vacuum region 14. At this location, the adaptor member 8' is connected, via a superconducting connection 7a', with a lead at one side of the HTS section 4, which is located in the vacuum region 14. An HTS conductor on the other side is superconductively connected to an adaptor member 8'' at joint 7a''. The adaptor piece 8'' leads back through the vacuum feed through 18 into the helium region 9 at joint 7b''', and is connected to the end of a superconducting short circuiting switch 20 for the overall coil configuration 4, 5, 6. The other end of the short circuiting switch 20 is once more connected by means of joint 7b'''' to the section 6.

Figure 4:
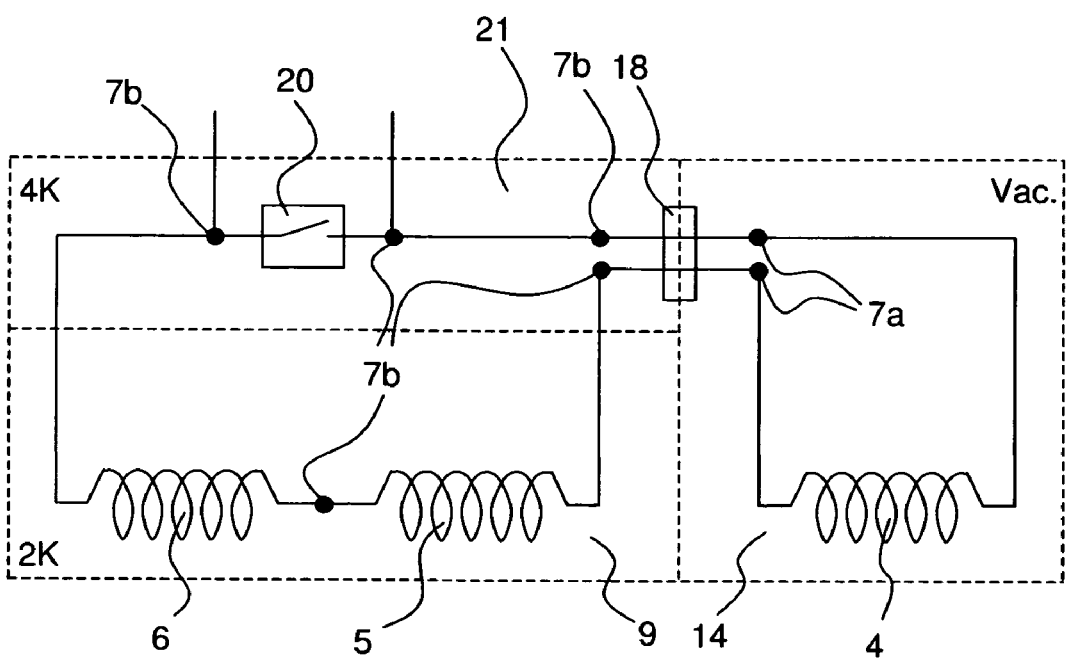
FIG. 4 shows a schematic circuit diagram of the sections of FIG. 2.

FIG. 4 shows corresponding circuiting of the sections 4, 5 and 6 for the embodiment in accordance with FIG. 2. In this case, however, there are two helium regions 9 and 21 located at different temperatures (approximately 2 K and approximately 4 K) in correspondence with helium tank 9 (at 2 K) and the additional helium tank 21 (at 4 K). Moreover, there is a vacuum region 14 corresponding to the previous vacuum region 14.

The feed-through 18 extends from the vacuum portion 14 into the 4 K region 21 in which the superconducting switch 20 is also located. The LTS sections 5, 6 are located in the 2 K region 9. Some or all of these components can be located in the 4 K region 21 or in the 2 K region 9 in dependence on the topological conditions and on the configuration of the joints 7a, 7b and/or of the switch 20 with regard to their temperature and field carrying capacities. The feed-through 18 preferentially feeds into the 4 K region 21 where no superfluid helium is located. This increases the safety. In principle, the feed through 18 can also be directly fed into the 2 K region in the event that sealing of superfluid helium is guaranteed.

The cryostats 1 of FIGS. 1a, 1b, and 2 are preferentially parts of an NMR apparatus such as an NMR spectrometer or an NMR tomography apparatus, in particular, a high field NMR spectrometer having a magnetic field in the measuring volume $B_0 > 20$ T, preferentially >23 T, wherein the magnetic coil system satisfies the requirements of high resolution NMR spectroscopy with regard to the magnetic field $B_0$ homogeneity in the measuring volume and the temporal stability of $B_0$, which, in general requires that the coil sections of the magnetic coil system be operated in persistent current mode. As is shown in the examples, the coil axes and the room temperature bore are normally vertical. The invention, however, also concerns cryostats having horizontal bores which are preferentially utilized in imaging applications (MRI) or for ion cyclotron resonance from spectrometers.

I claim:
1. A cryostat and magnet coil system, the magnet coil system having a plurality of radially nested superconducting solenoid-shaped coil sections surrounding a room temperature bore defined by the cryostat, the coil sections being electrically connected in series for production of a magnet field $B_0$ in a measuring volume within the room temperature bore, the cryostat and magnet coil system comprising:
   a helium tank for holding liquid helium at a helium temperature $T_L$, said helium tank having a wall facing the room temperature bore of the cryostat;
   an LTS section of a conventional low temperature superconductor (LTS) disposed in said helium tank at said helium temperature $T_L$;
   means defining a vacuum portion of the cryostat; and
   at least one HTS section disposed radially within said LTS section and within said vacuum portion of the cryostat, said HTS section being separated from said LTS section by said wall of said helium tank facing said room temperature bore.

2. The cryostat of claim 1, wherein a temperature of the liquid helium $T_L$ is less than 4 K, less than 2.5 K, or less than 2.2 K.

3. The cryostat of claim 2, further comprising an additional helium tank to contain liquid helium at a temperature of approximately 4.2 K.

4. The cryostat of claim 3, wherein a series connection between said LTS section in said helium tank and said HTS section in said vacuum portion passes through said additional helium tank.

5. The cryostat of claim 3, wherein said additional helium tank is disposed above said helium tank about a common, vertically orientated room temperature bore.

6. The cryostat of claim 5, wherein a wall of said additional helium tank facing the room temperature bore is radially separated from the room temperature bore by a same amount as said wall of said helium tank facing the room temperature bore.

7. The cryostat of claim 1, wherein superconducting leads to at least one said HTS section also extend through said vacuum portion, at least to an extent that said leads contain HTS.

8. The cryostat of claim 1, wherein said vacuum portion has a pressure-measuring device.

9. The cryostat of claim 1, wherein said LTS section is rigidly mechanically connected to said HTS section.

10. The cryostat of claim 9, wherein said LTS section is connected to said HTS via said wall of said helium tank.

11. The cryostat of claim 1, wherein said HTS section is thermally coupled to said wall of said helium tank.

12. The cryostat of claim 1, wherein at least one radiation shield is disposed between said HTS section and the room temperature bore.

13. The cryostat of claim 1, wherein said vacuum portion contains sorption medium for helium or activated charcoal.

14. The cryostat of claim 1, wherein the magnet coil system produces a magnetic field $B_0$ in the measurement volume, which is larger than 20 T or larger than 23 T.

15. The cryostat of claim 1, wherein coil sections of the magnet coil system are operated in persistent current mode.

16. The cryostat of claim 15, wherein the magnet coil system fulfills requirements of high resolution NMR spectroscopy with regard to a homogeneity as well as temporal stability of the magnetic field $B_0$ in the measurement volume.

* * * * *